(12) United States Patent
Yagishita

(10) Patent No.: US 7,405,449 B2
(45) Date of Patent: Jul. 29, 2008

(54) SEMICONDUCTOR DEVICE AND METHOD OF MANUFACTURING THE SAME

(75) Inventor: Atsushi Yagishita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/236,723

(22) Filed: Sep. 28, 2005

(65) Prior Publication Data

US 2006/0071291 A1    Apr. 6, 2006

(30) Foreign Application Priority Data

Sep. 29, 2004   (JP)   ............................ 2004-285462

(51) Int. Cl.
*H01L 27/088*   (2006.01)
(52) U.S. Cl. .................. 257/382; 257/383; 257/384; 257/E29.013; 257/E29.311
(58) Field of Classification Search ............... 257/410, 257/330, 347, 352, 353, 401, E29.116, E29.117, 257/E29.148, E29.271, 382, 383, 384, E29.013, 257/E29.311
See application file for complete search history.

(56) References Cited

U.S. PATENT DOCUMENTS

2004/0026736 A1* 2/2004 Grupp et al. ................ 257/330

2004/0217430 A1* 11/2004 Chu ........................... 257/410

FOREIGN PATENT DOCUMENTS

JP   2002-289871   10/2002

OTHER PUBLICATIONS

Kedzierski et al.; "Complementary Silicide Source/Drain Thin-Body MOSFETs for the 20nm Gate Length Regime"; IEDM Technical Digest, pp. 57-60, (2000).
Yagishita; "Semiconductor Device and Method for Manufacturing the Same"; U.S. Appl. No. 11/116,328, filed Apr. 28, 2005.

* cited by examiner

*Primary Examiner*—Minh-Loan Tran
*Assistant Examiner*—Benjamin Tzu-Hung Liu
(74) *Attorney, Agent, or Firm*—Finnegan, Henderson, Farabow, Garrett & Dunner, L.L.P.

(57) ABSTRACT

A semiconductor device includes a semiconductor substrate, and a MOS transistor provided on the semiconductor substrate and having a channel type of a first conductivity, the MOS transistor comprising a semiconductor region of the first conductivity type including first and second channel regions, gate insulating films provided on the first and second channel regions, a gate electrode provided on the gate insulating films, and first and second source/drain regions which are located at a distance from each other so as to sandwich the first and second channel regions, the first and second source/drain regions contacting the semiconductor region of the first conductivity type and forming a Schottky junction.

20 Claims, 11 Drawing Sheets

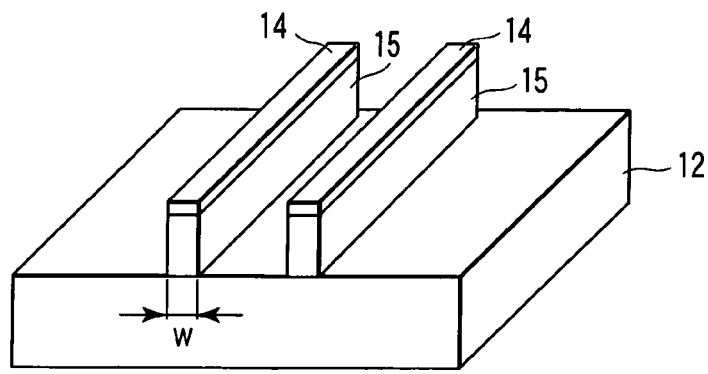
F I G. 4
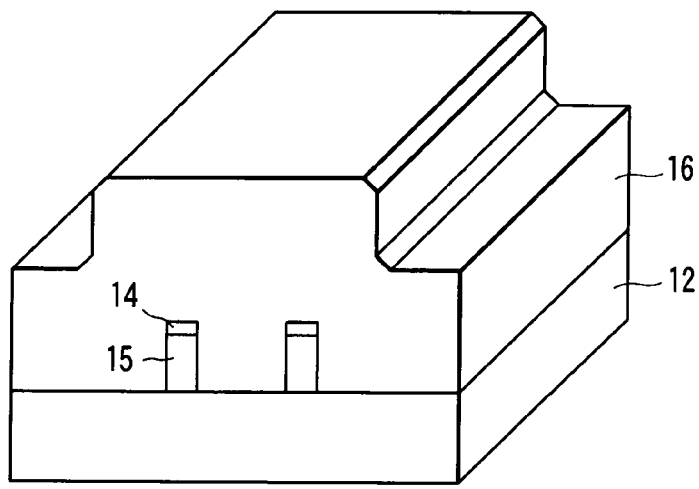
F I G. 5
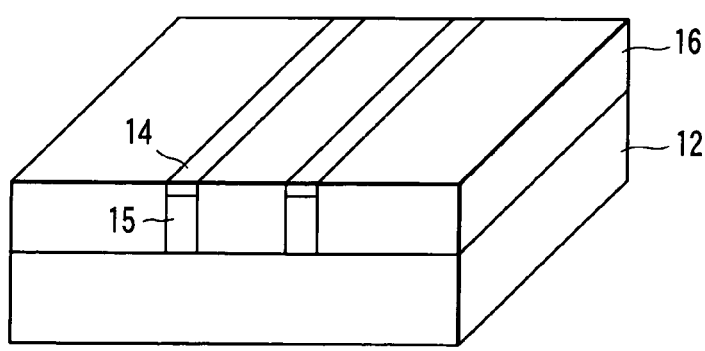
F I G. 6

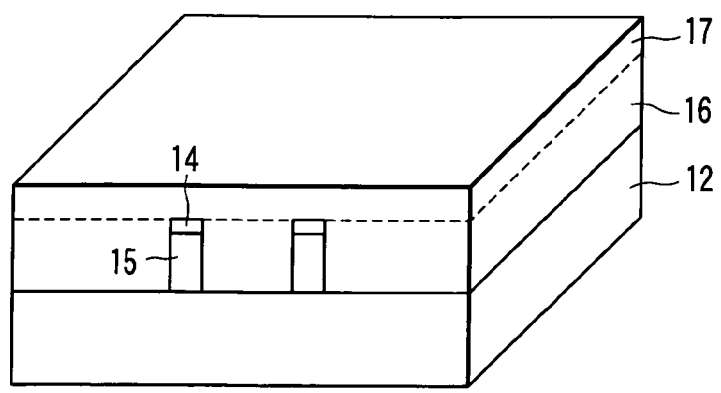
F I G. 7
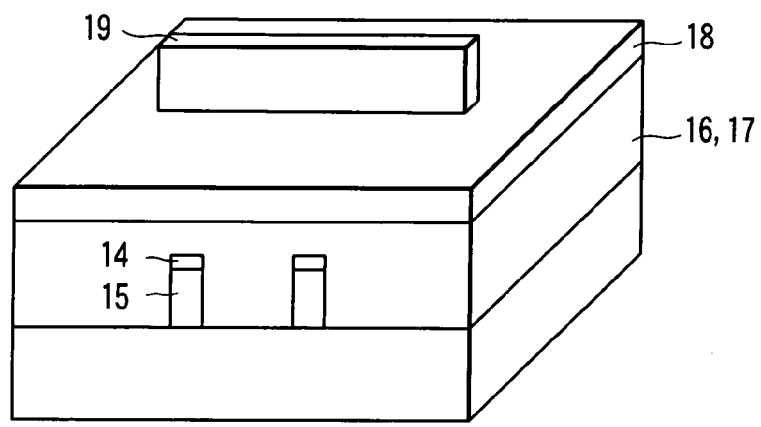
F I G. 8
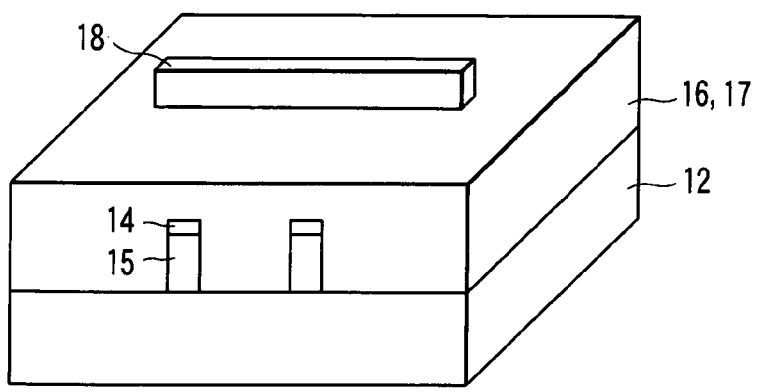
F I G. 9

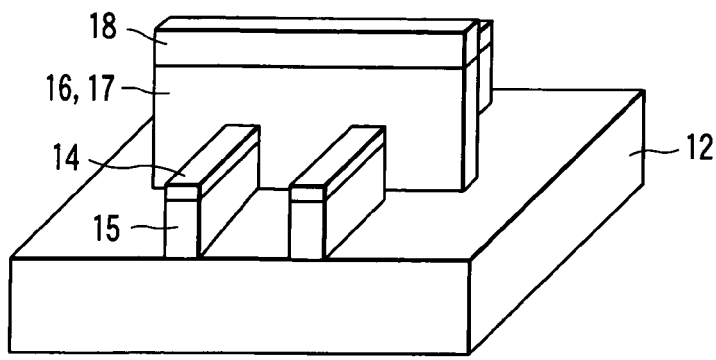
F I G. 10
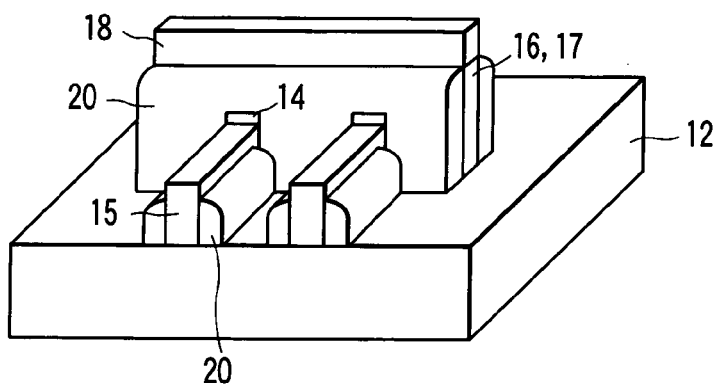
F I G. 11
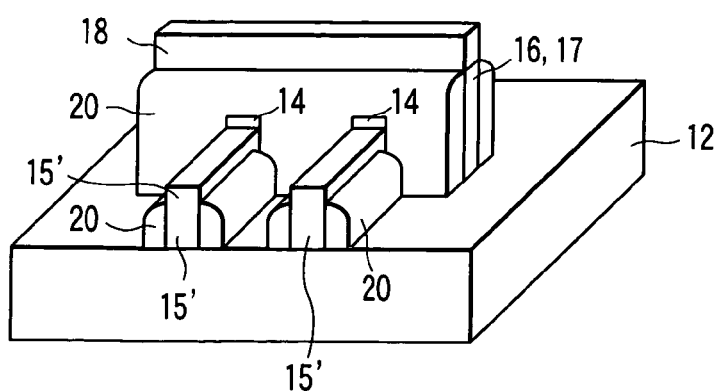
F I G. 12

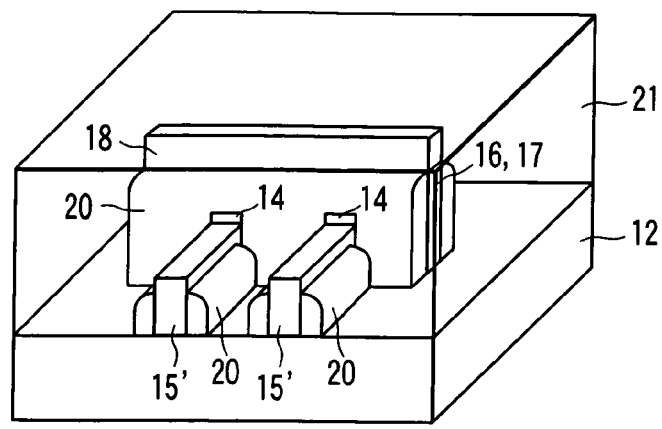
F I G. 1 3
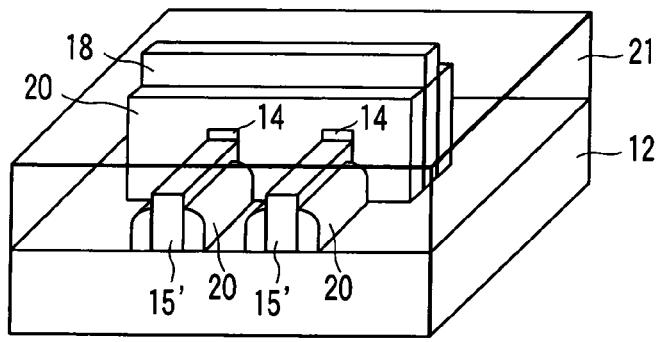
F I G. 1 4
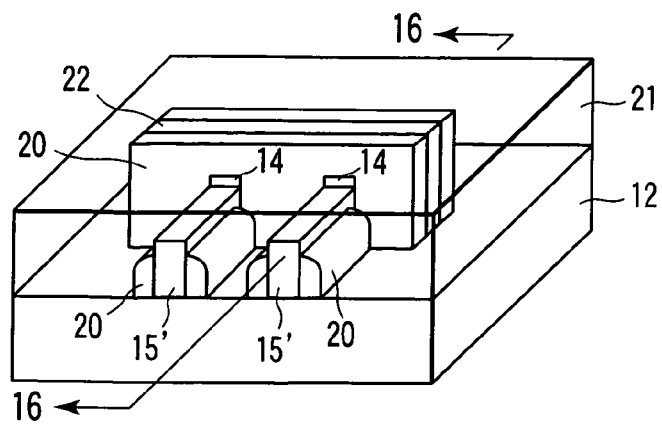
F I G. 1 5

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-285462, filed Sep. 29, 2004, the entire contents of which are incorporated herein by reference.

BACKGROUND OF THE INVENTION

1. Field of the Invention

The present invention relates to a semiconductor device including a MOS transistor, and a method of manufacturing the semiconductor device.

2. Description of the Related Art

As an improved MOS transistor, a MOS transistor (Schottky source/drain transistor) that has source/drain regions with a Schottky junction (a Schottky source/drain structure) is known (Jakub Kedzierski, et al., IEDM Technical Digest, pp. 57-60, 2000). The source/drain regions of the transistor are conductive layers that contain a metal or a metal silicide, instead of impurity diffusion layers.

The Schottky source/drain transistor can reduce the parasitic resistance in the source/drain regions, and also can advantageously reduce the junction depth (the Schottky junction) of the source/drain regions.

Since impurity diffusion layers are not used for the source/drain regions, there is no need to perform a high temperature heating process to activate the impurity. Accordingly, the manufacturing process is greatly simplified, and as a result, the LSI manufacturing cost is reduced.

Further, as a Schottky barrier exists at the source edge, off current is suppressed, and, as a result, short channel effect is suppressed. Thereby, the device is easily miniaturized.

However, the conventional Schottky source/drain transistor has the following problems.

In the case of a usual transistor, source/drain regions are made of the same material (silicon) as channel region. Accordingly, there is no problem with the contact resistance between the channel region and the source/drain-regions.

On the contrary, in the case of the source/drain regions of the Schottky source/drain transistor, the source/drain regions are made of a different material from the channel region. Therefore, it is necessary to reduce the contact resistance between the channel region and the source/drain regions (the interface resistance Rc between the Si and the silicide).

As a solution for the problem, there is a source/drain material work function control technology. For example, a method using a metal or silicide (such as $ErSi_2$) having a small work function for the source/drain regions of an nmOS and using a metal or silicide (such as PtSi) having a large work function for the source/drain regions of a PMOS is proposed.

Using the work function control method, a Schottky barrier of an n-channel MOS (NMOS) transistor can be made to be approximately 0.28 eV, and a Schottky barrier of a p-channel MOS (PMOS) transistor can be made to be approximately 0.22 eV. Accordingly, source/drain regions (metal-silicide source/drain) with relatively low Schottky contact resistance can be formed for both of the nmOS and PMOS.

In this manner, the value of the Schottky barrier can be reduced by the work function control method, though, the above mentioned values are still too large to obtain sufficiently high current. However, with the work function control method only, a further decrease in the Schottky barrier is difficult due to bad influence of Fermi-level pinning effects.

Further, a technique for reducing an interface resistance Rc by providing an extension (an impurity diffusion layer) in the Schottky junction is proposed. However, it is difficult to form a shallow extension with high impurity concentration in a very small device.

BRIEF SUMMARY OF THE INVENTION

According to an aspect of the present invention, there is provided a semiconductor device comprising: a semiconductor substrate; and a MOS transistor provided on the semiconductor substrate and having a channel type of a first conductivity, the MOS transistor comprising a semiconductor region of the first conductivity type including first and second channel regions, gate insulating films provided on the first and second channel regions, a gate electrode provided on the gate insulating films, and first and second source/drain regions which are located at a distance from each other so as to sandwich the first and second channel regions, the first and second source/drain regions contacting the semiconductor region of the first conductivity type and forming a Schottky junction.

According to an aspect of the present invention, there is provided a method of manufacturing a semiconductor device comprising: forming a MOS transistor having a channel type of a first conductivity type on a semiconductor substrate, the forming the MOS transistor comprising: forming first and second semiconductor regions to be first and second source/drain regions, and a semiconductor region of the first conductivity type including first and second channel regions; forming a semiconductor film on the first and second channel regions via gate insulating films; and turning the first and second semiconductor regions and the semiconductor film into metal semiconductor compound regions including metal and semiconductor.

According to another aspect of the present invention, there is provided a method of manufacturing a semiconductor device comprising: forming a MOS transistor having a channel type of a first conductivity type on a semiconductor substrate, the forming the MOS transistor comprising: forming first and second semiconductor regions to be first and second source/drain regions, and a semiconductor region of the first conductivity type including first and second channel regions; forming a semiconductor film on the first and second channel regions via gate insulating films; and depositing a metal material on the first and second semiconductor regions and a region where the semiconductor film is removed.

BRIEF DESCRIPTION OF THE SEVERAL VIEWS OF THE DRAWING

FIG. 4 is a perspective view illustrating a process for manufacturing the transistor following FIG. 3;

FIG. 5 is a perspective view illustrating a process for manufacturing the transistor following FIG. 4;

FIG. 6 is a perspective view illustrating a process for manufacturing the transistor following FIG. 5;

FIG. 7 is a perspective view illustrating a process for manufacturing the transistor following FIG. 6;

FIG. 8 is a perspective view illustrating a process for manufacturing the transistor following FIG. 7;

FIG. 9 is a perspective view illustrating a process for manufacturing the transistor following FIG. 8;

FIG. 10 is a perspective view illustrating a process for manufacturing the transistor following FIG. 9;

FIG. 11 is a perspective view illustrating a process for manufacturing the transistor following FIG. 10;

FIG. 12 is a perspective view illustrating a process for manufacturing the transistor following FIG. 11;

FIG. 13 is a perspective view illustrating a process for manufacturing the transistor following FIG. 12;

FIG. 14 is a perspective view illustrating a process for manufacturing the transistor following FIG. 13;

FIG. 15 is a perspective view illustrating a process for manufacturing the transistor following FIG. 14;

DETAILED DESCRIPTION OF THE INVENTION

Embodiments of the present invention are explained below with reference to the accompanying drawings.

First Embodiment

Figure 1:
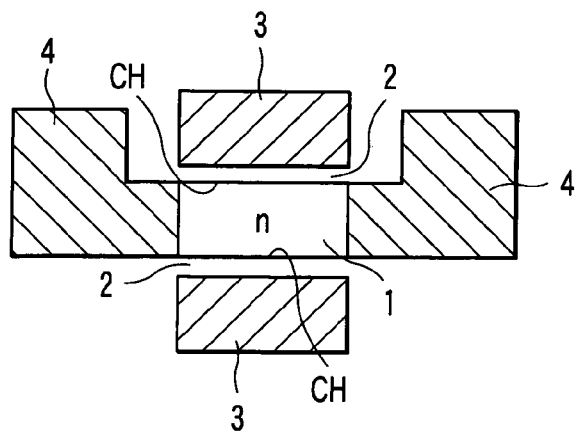
FIG. 1 is a schematic view of a MOS transistor that includes a Schottky source/drain structure according to the first embodiment of the present invention.

FIG. 1 is a schematic view of a MOS transistor that includes a Schottky source/drain structure according to the first embodiment of the present invention. The MOS transistor of the present embodiment is used for a logic LSI circuit, for example.

In FIG. 1, reference numeral 1 indicates an n-type Si body in a Si substrate or an SOI substrate. The Si body 1 has two channel regions CH (first and second channel regions) that are located on the opposite sides from each other.

Gate insulating films 2 are formed on the respective channel regions CH, and a gate electrode 3 is formed on the gate insulating films 2. The Si body 1, the gate insulating films 2, and the gate electrode 3 make a double-gate structure. The material of the gate electrode 3 is a metal silicide containing Pt and Si.

Two source/drain regions 4 (the first and second source/drain regions) are provided on both sides of the Si body 1 so as to sandwich the channel regions CH. The source-drain regions 4 are made of a metal silicide containing Er and Si. The source/drain regions 4 and the Si body 1 make a Schottky junction.

The MOS transistor of the present embodiment is a type has a Schottky source/drain structure, but has the same channel type as the conductivity type of the Si body 1, which is n type. Therefore, the MOS transistor of the present embodiment is a transistor (an accumulation mode FET) that operates in an accumulation mode.

In the accumulation mode, the impurity concentration in the Si body 1 can be made higher than that in an inversion mode (in a usual transistor that has the opposite channel type from the conductivity type of the Si body 1). Accordingly, an interface resistance Rc between the channel regions CH and the source/drain regions 4 can be reduced. In other words, a decrease in the Schottky barrier is realized (the barrier is made thinner).

Further, in the accumulation mode, the carrier mobility can be increased because a vertical direction electric field of the channel becomes small. As a result, in the MOS transistor of the present embodiment, a drive current $I_{on}$ can be made greater than that in a transistor having a conventional Schottky source/drain structure.

The MOS transistor of the present embodiment further comprises a double-gate structure. In the double-gate structure, the carrier mobility can be made high because the vertical direction electric field of the channel becomes small. As a result, in the MOS transistor of the present embodiment, the drive current $I_{on}$ can be made greater than in a transistor having a conventional Schottky source/drain structure. That is, according to the present embodiment, the combination of the accumulation mode and the double-gate structure easily increases the drive current $I_{on}$.

Here, a double-gate structure can effectively restrict short channel effects, though, a transistor having a conventional double-gate structure is difficult to manufacture. For example, in the case of a FinFET, it is difficult to form the extensions in the source and drain uniformly in a direction of height of the Fin. Further, in the case of a double-gate FET of a planar type, it is difficult to form two gate electrodes in a self-aligning manner.

On the other hand, the MOS transistor of the present embodiment has the Schottky source/drain structure that can effectively suppress short channel effects. Therefore, it is not necessary to dope the source and drain with impurities when a double-gate structure is formed (there is no need to form shallow and high concentration extensions). Accordingly, the MOS transistor of the present embodiment can be easily manufactured, despite the double-gate structure. As a result, the manufacturing cost can be reduced. Further, impurity diffusion layers (a deep junction) as source/drain regions is unnecessary in the present embodiment, thereby, the manufacturing process can be more simplified and the manufacturing cost can be further reduced.

In the present embodiment, the nmOS (n-channel MOS) is referred, however, in a case of a PMOS (p-channel MOS), a p-type body 1 is employed, a metal semiconductor compound containing Er and Si ($ErSi_{1.7}$) is used for instance as the material of the gate electrode 3, and a metal semiconductor compound containing Pt and Si (platinum silicide) is used for instance as the material of the source/drain regions 4.

The materials of the source/drain regions 4 and, the gate electrode 3 are not limited to the above-mentioned materials. In the case of an nmOS, it is desirable to employ such a material that the work function of the gate electrode 3 becomes greater than 4.6 eV (the mid-gap of silicon). In the case of a PMOS, it is desirable to employ such a material that the work function of the gate electrode 3 becomes smaller than 4.6 eV. By employing a material that satisfies the above conditions, the off state characteristics (such as leak current) can be effectively improved. An nmOS and a PMOS may be formed in a Si substrate.

As described above, the following effects can be achieved by the present embodiment.

(1) The double-gate structure and the Schottky source/drain structure make the transistor highly resistant to short channel effects (the problem with conventional accumulation-mode FETs is eliminated).

(2) Since the extensions and deep junction are not necessary, the manufacturing cost of the transistor can be reduced, and the process for manufacturing the transistor can be simplified (one of the problems with conventional double-gate FETs is eliminated).

(3) The interface resistance Rc between Si and silicide in the source/drain regions can be reduced (the drive current $I_{on}$ can be increased). This is because a reduction in the Schottky barrier is realized (the barrier is made thinner) by a high electric field (at the Schottky junction) formed by the relatively high concentration n-type body 1 and electric field applied from the double-gate structure. The aspect that the interface resistance Rc can be reduced without forming the extension diffusion layers in the body 1 is a great merit.

Second Embodiment

Figure 2:
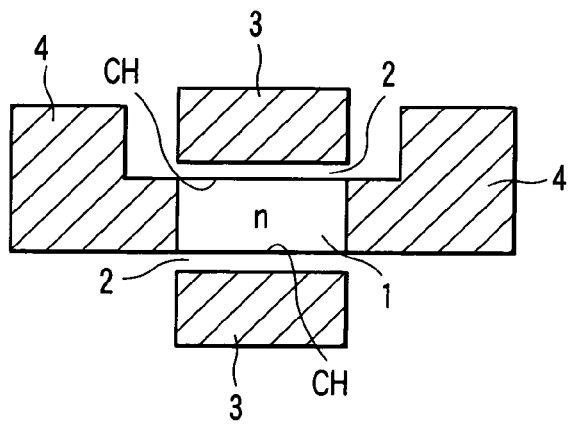
FIG. 2 is a schematic view of a MOS transistor that includes a Schottky source/drain structure according to the second embodiment of the present invention.

FIG. 2 is a schematic view of a MOS transistor that includes a Schottky source/drain structure according to the second embodiment of the present invention. In FIG. 2, the same reference numerals as FIG. 1 are given to designate portions corresponding to FIG. 1, and the details are omitted.

The present embodiment differs from the first embodiment in that the metal semiconductor compound in the gate electrode 3 is the same as the metal semiconductor compound in the source/drain regions 4. More specifically, the metal semiconductor compound is nickel silicide. The gate electrode 3 is doped with a p-type impurity such as boron, and the Si body 1 is doped with an n-type impurity such as phosphorus.

In the present embodiment, the gate electrode 3 and the source/drain regions 4 are made of the same metal semiconductor compound as described above. Accordingly, the manufacturing process can be further simplified, and the manufacturing cost can be further reduced. Other than that, the same effects as those of the first embodiment can be achieved.

In the present embodiment, the nmOS (n-channel MOS) is referred, however, in a case of a PMOS (p-channel MOS), the Si body 1 is doped with a p-type impurity such as boron, and the gate electrode 3 is doped with an n-type impurity such as phosphorus or arsenic, instead of a p-type impurity.

Further, the material of the gate electrode 3 and the source/drain regions 4 is not limited to nickel silicide. By doping the gate electrode 3, the work function of the gate electrode 3 is preferably adjusted to a value greater than 4.6 eV (the mid-gap of Si) in the case of an nmOS. In the case of a PMOS, the work function of the gate electrode 3 is preferably adjusted to a value smaller than 4.6 eV. By employing the doping conditions that satisfy the above requirements, the off state characteristics (such as leak current) can be effectively improved. Thus, threshold voltage can be controlled.

Third Embodiment

FIGS. 3 to 15 are perspective views illustrating a process for manufacturing a MOS transistor that includes a Schottky source/drain structure according to the third embodiment of the present invention. The MOS transistor of the present embodiment is used for a logic LSI circuit, for example. The MOS transistor of the present embodiment is a more specific example of the MOS transistor of the first embodiment.

Figure 3:
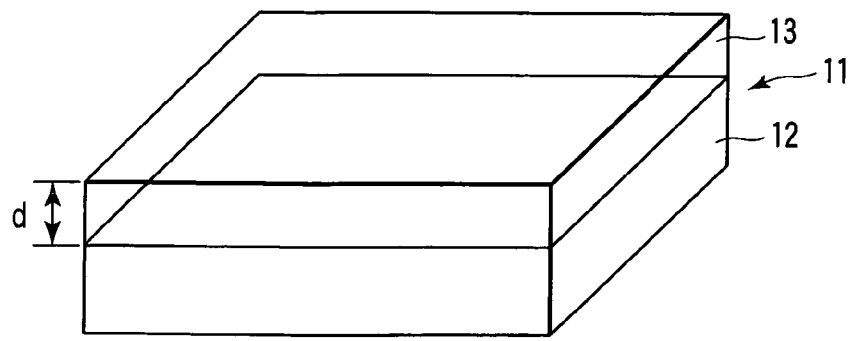
FIG. 3 illustrates a process for manufacturing a MOS transistor that includes a Schottky source/drain structure according to the third embodiment of the present invention.

First, an SOI substrate 11 is prepared. The SOI substrate 11 includes an insulating layer 12 and a Si layer 13 provided on the insulating layer 12. The thickness d of the Si layer 13 is approximately 50 to 100 nm (FIG. 3).

The SOI substrate 11 is formed by a known technique such as the SIMOX technique or a direct bonding technique. In the case of an nmOS, the Si layer 13 to be channel regions (a body region) is doped with an n-type impurity.

Next, hard mask 14 is formed on the Si layer 13. The material of the hard mask 14 is silicon nitride, for example. The thickness of the hard mask 14 is approximately 70 nm. Using the hard mask 14 as a mask, the Si layer 13 is etched by RIE process, so as to form convex Si layers 13 on the insulating layer 12. The convex Si layers 13 are hereinafter referred to as Si-Fin portions 15 (FIG. 4). The width W of each of the Si-Fin portions 15 is approximately 10 nm. The height of each of the Si-Fin portions 15 is the same as the thickness d of the Si layer 13.

Next, gate insulating films (not shown) are formed on the side surfaces of the Si-Fin portions 15 by thermal oxidation, for example. The gate insulating films may be formed by a deposition process such as the CVD process. In such a case, the gate insulating films is also formed on the hard mask 14. The gate insulating films may be an insulator other than the silicon dioxide film (For example, $HFO_2$, HfSiON, etc.). The first polycrystalline silicon film 16 is formed on the region that includes the gate insulating films, the Si-Fin portions 15, the hard mask 14, and the insulating layer 12 (FIG. 5). The thickness of the first polycrystalline silicon film 16 is approximately 300 nm. The first polycrystalline silicon film 16 is to be a first-layer polycrystalline Si gate electrode. As there are large step portions formed by the Si-Fin portions 15 and the insulating layer 12, there also are large step portions on the surface of the first polycrystalline silicon film 16.

Next, the first polycrystalline silicon film 16 is etched back by a CMP process until the hard mask 14 is exposed, so that the plane including the surfaces of hard mask 14 and the first polycrystalline silicon film 16 is planarized (FIG. 6).

Next, a second polycrystalline silicon film 17 is formed on the hard mask 14 and the first polycrystalline silicon film 16 that form the planarized plane (FIG. 7). The thickness of the second polycrystalline silicon film 17 is approximately 50 nm. The second polycrystalline silicon film 17 is to be a second-layer polycrystalline Si gate electrode.

Next, a silicon nitride film 18 is formed on the second polycrystalline silicon film 17. The thickness of the silicon nitride film 18 is approximately 100 nm. The silicon nitride film 18 is to be a hard mask. A resist pattern 19 is formed on the silicon nitride film 18 (FIG. 8).

Next, Using the resist pattern 19 as a mask, the silicon nitride film 18 is etched so as to form a hard mask 18 on the second polycrystalline silicon film 17, thereafter, the resist pattern 19 is removed (FIG. 9).

Next, Using the hard mask 18 as a mask, the first and second polycrystalline silicon film 16, 17 are etched by RIE process, so as to form a polycrystalline Si gate electrodes 16, 17 (FIG. 10).

Next, spacers 20 are formed on the side walls of the polycrystalline Si gate electrodes 16, 17. The material of the spacers 20 (the gate side wall material) is TEOS, for example. The thickness of each of the spacers 20 is approximately 40 nm. The process for forming the spacers 20 includes the step of depositing the gate side wall material on the entire surface, and the step of etching back the deposited gate side wall material by RIE process. The hard mask 14 on the regions to be the source/drain regions is removed by RIE process (FIG. 11). The RIE process conditions (the etching conditions) and the deposition thickness of the hard mask 18 are adjusted so that the hard mask 18 remains after the hard mask 14 is removed.

Next, metal film (not shown), such as refractory metal film, is formed on the region that includes the Si-Fin portions 15 of the source/drain regions. The Si-Fin portions 15 are turned into metal semiconductor compound portions 15' as source/drain regions by thermal treatment to make the Si-Fin portions 15 react with the metal film. Non-reacted portion of the refractory metal film is removed (FIG. 12). The material of the metal semiconductor compound portions 15' is ErSi in the case of an nmOS, and is PtSi in the case of a PMOS, for example. When the Si-Fin portions 15 are silicided, the polycrystalline Si gate electrode 16, 17 is covered with the hard mask 18 and the spacers 20. Accordingly, the polycrystalline Si gate electrode 16, 17 is not silicided at this point.

Next, an interlayer insulating film 21 is deposited on the entire surface. The interlayer insulating film 21 is a TEOS film, for example. The thickness of the interlayer insulating film 21 is approximately 400 nm. Thereafter, the surface of the interlayer insulating film 21 is planarized by the CMP process (FIG. 13).

Next, the entire surface of the interlayer insulating film 21 is etched back, so that the upper surface and the side surfaces of the hard mask 18 are exposed as shown in FIG. 14.

Next, the hard mask 18 is removed by hot phosphoric acid, so as to expose the upper surface of the polycrystalline Si gate electrode 17. A metal film (not shown) is deposited on the entire surface.

The polycrystalline Si gate electrodes 16, 17 is turned into a semiconductor metal compound gate electrode 22 by thermal treatment to make the polycrystalline Si gate electrode 17 react with the metal film (FIG. 15).

Figure 16:
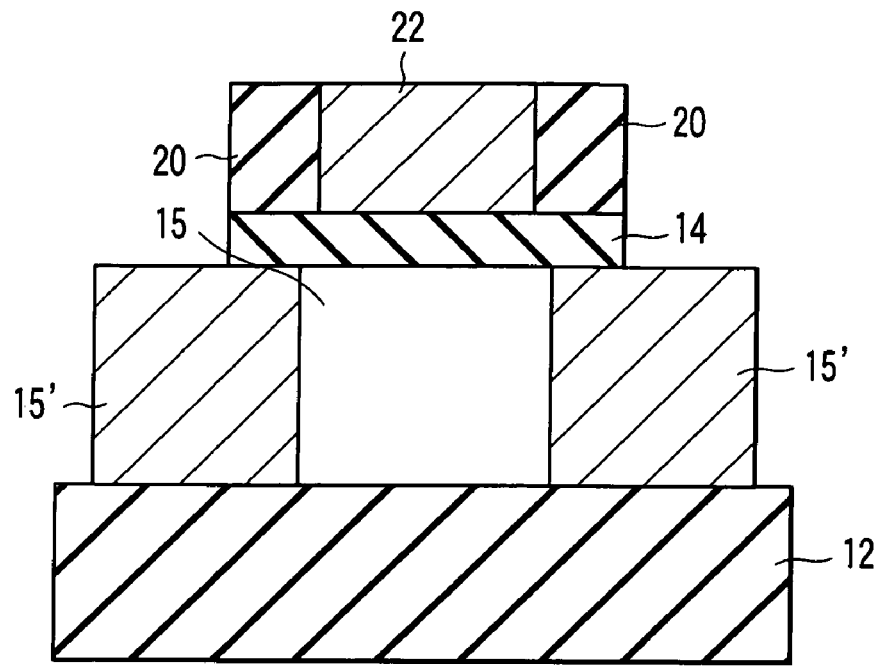
FIG. 16 is an A-A' cross sectional view shown in FIG. 15.
Figure 17:
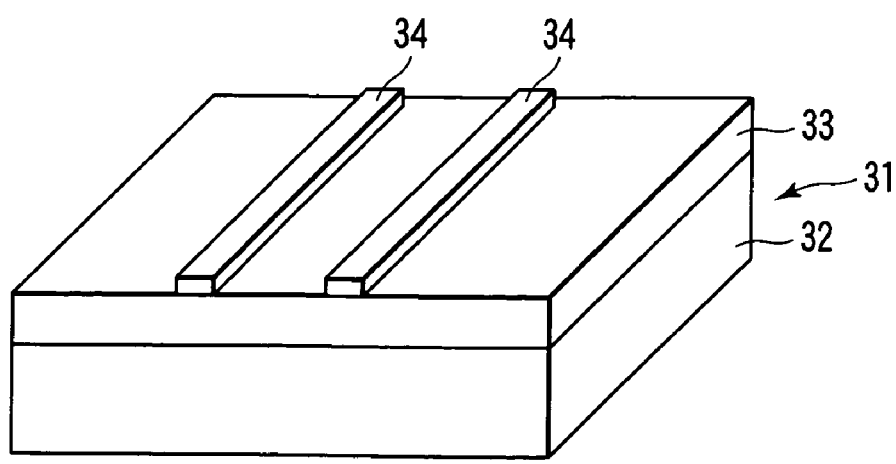
FIG. 17 illustrates a process for manufacturing a MOS transistor that includes a Schottky source/drain structure according to the fourth embodiment of the present invention.

FIG. 16 is a cross-sectional view of the MOS transistor taken along the line A-A of FIG. 15. The non-reacted portion of the metal film is removed. The material of the metal film is, for example, platinum silicide in the case of an nmOS, and is, for example, a metal semiconductor compound containing Er and Si in the case of a PMOS.

Alternatively, the polycrystalline Si gate electrodes is removed by down flow etching or the like, and a gate insulating film is formed newly, thereafter, a metal gate electrode (a metal region) is formed by depositing a metal material on the entire surface so as to bury a region where the polycrystalline Si gate electrodes is removed and planarizing by CMP process.

In a case where metal source/drain regions are to be formed, the following process can be employed.

First, in the process shown in FIG. 12, the metal semiconductor compound portions 15' are not formed. In the process shown in FIG. 15, openings are formed in the interlayer insulating film 21 on the regions to be the metal source/drain regions. The Si-Fin portions 15 are exposed on the bottoms of the openings. Next, the metal source/drain regions is obtained by depositing a metal material on the entire surface so as to bury the openings and planarizing by CMP process.

In a case where the channel type of the MOS transistor is p-type, the material of the gate electrodes is for example, RuTa, Ta, Hf—AlN, TaN, Mo (with Ar being ion-implanted therein), Ti, or Er, and the material of the source/drain regions is for example, Ru, Ta—AlN, Mo, NiGe, Pt, Ni, or W.

In a case where the channel type of the MOS transistor is n-type, the material of the gate electrodes is for example, Ru, Ta—AlN, Mo, NiGe, Pt, Ni, or W, and the material of the source/drain regions is for example, RuTa, Ta, Hf—AlN, TaN, Mo (with Ar being ion-implanted therein), Ti, or Er.

According to the present embodiment, a double-gate Fin-type MOS transistor that operates in the accumulation mode and has a Schottky source/drain structure can be formed, and the following effects is obtained.

(1) The double-gate structure and the Schottky source/drain structure make the transistor highly resistant to short channel effects (the problem with conventional accumulation-mode MOS transistors can be eliminated).

(2) Since the extension and deep junction are not required, the manufacturing cost of the transistor can be reduced, and the process for manufacturing the transistor can be simplified (one of the problems with conventional double-gate Fin-type MOS transistors can be eliminated).

(3) The resistance Rc (the interface resistance between Si and silicide) in the source/drain regions can be reduced (the drive current $I_{on}$ can be increased). This is because a decrease in the Schottky barrier is realized (the barrier is made thinner) by a high electric field (at the Schottky junction) formed by the relatively high concentration n-type body and the electrical field applied from the double-gate structure. The aspect that the interface resistance Rc can be reduced without forming the extension diffusion layers in the body is a great merit.

(4) The silicide material of the source/drain regions is ErSi in an nmOS and is PtSt in a PMOS. Accordingly, the interface resistance Rc is reduced, and high driving force can be achieved.

(5) The silicide material of the gate electrodes is PtSi in an nmOS and is ErSi in a PMOS. Accordingly, the threshold voltage of the transistor can be adjusted to a reasonable voltage of 0.2 V or lower.

Fourth Embodiment

FIGS. 17 to 23 are perspective views illustrating the process for manufacturing a MOS transistor that includes a Schottky source/drain structure according to the fourth embodiment of the present invention. The MOS transistor of the present embodiment is used for a logic LSI circuit, for example. The MOS transistor of the present embodiment is a more specific example of the MOS transistor of the second embodiment.

First, an SOI substrate 31 is prepared. The SOI substrate 31 includes an insulating layer 32 and a Si layer 33 provided on the insulating layer 32. The thickness of the Si layer 33 is approximately 50 to 100 nm. The SOI substrate 31 is formed by a known technique such as the SIMOX technique or a direct bonding technique. In the case of an nmOS, the Si layer 33 to be channel regions (a body region) is doped with an n-type impurity. Hard mask 34 is formed on the Si layer 33. The material of the hard mask 34 is silicon nitride. The thickness of the hard mask 34 is approximately 70 nm.

Next, using the hard mask 34 as mask, the Si layer 33 is etched by RIE process, so as to form convex Si layers 33 on the insulating layer 32. The convex Si layers 33 are hereinafter referred to as Si-Fin portions 35. The width of each of the Si-Fin portions 35 is approximately 10 nm.

Next, gate insulating films (not shown) are formed on the side surfaces of the Si-Fin portions 35 by thermal oxidation, for example. The gate insulating films may be formed by a deposition process such as the CVD process. In this case, the gate insulating films are also formed on the hard mask 34. The gate insulating films may be an insulating film other than the silicon dioxide film. The first polycrystalline silicon film 36 is formed on a region that includes the gate insulating films, the Si-Fin portions 35, the hard mask 34, and the insulating layer 32. The thickness of the first polycrystalline silicon film 36 is approximately 300 nm. The first polycrystalline silicon film 36 is to be a first-layer polycrystalline Si gate electrode. As there are large step portions formed by the Si-Fin portions 35 and the insulating layer 32, there also are large step portions on the surface of the first polycrystalline silicon film 36.

Next, the first polycrystalline silicon film 36 is etched back by CMP process until the hard mask 34 is exposed, so that the plane including the hard mask 34 and the surface of the first polycrystalline silicon film 36 is planarized.

Figure 18:
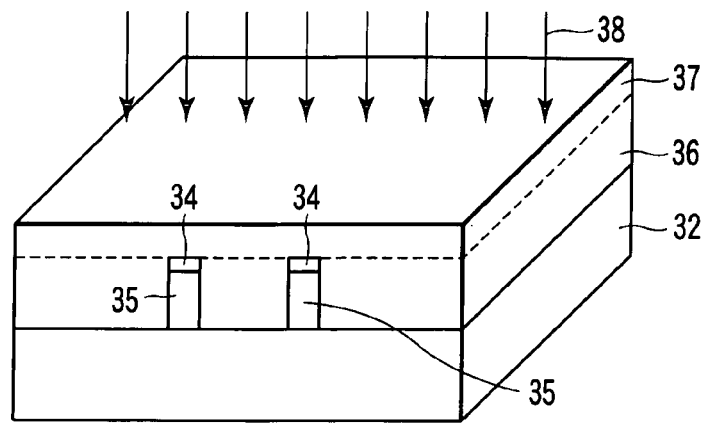
FIG. 18 is a perspective view illustrating a process for manufacturing the transistor following FIG. 17.

Next, the second polycrystalline silicon film 37 is formed on the hard mask 34 and the first polycrystalline silicon film 36 that form the planarized plane. Thereafter, impurity ions 38 are implanted into the first and second polycrystalline silicon films 36 and 37 by ion implanting process (FIG. 18).

The impurity is, for example, boron (B) in an nmOS, and is, for example, arsenic (As) or phosphorus (P) in a PMOS. The thickness of the second polycrystalline silicon film 37 is approximately 50 nm. The second polycrystalline silicon film 37 is to be a second-layer polycrystalline Si gate electrode.

Figure 19:
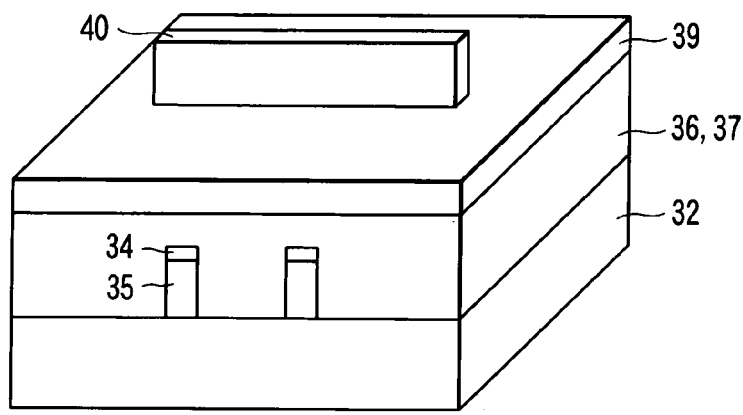
FIG. 19 is a perspective view illustrating a process for manufacturing the transistor following FIG. 18.

Next, a silicon nitride film 39 is formed on the second polycrystalline silicon film 37. The thickness of the silicon nitride film 39 is approximately 100 nm. The silicon nitride film 39 is to be a hard mask. A resist pattern 40 is formed on the silicon nitride film 39 (FIG. 19).

Figure 20:
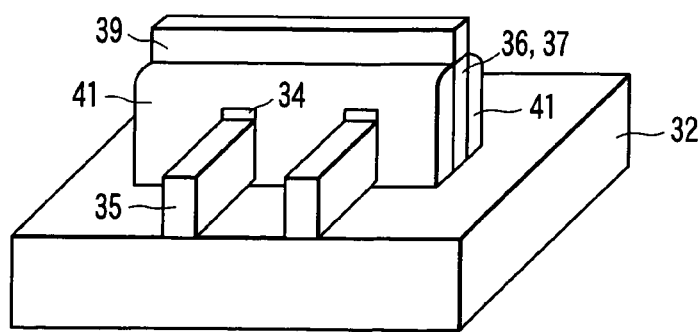
FIG. 20 is a perspective view illustrating a process for manufacturing the transistor following FIG. 19.

Next, using the resist pattern 40 as a mask, the silicon nitride film 39 is etched so as to form a hard mask 39 on the second polycrystalline silicon film 37, thereafter, the resist pattern 40 is removed. Using the hard mask 39 as a mask, the first and second polycrystalline silicon films 36 and 37 are etched by RIE process, so as to form a polycrystalline Si gate electrode 36, 37. Spacers 41 are formed on the side walls of the polycrystalline Si gate electrode 36, 37 (FIG. 20).

The material of the spacers 41 (the gate side wall material) is TEOS, for example. The thickness of each of the spacers 41 is approximately 40 nm. The process for forming the spacers 41 includes the step of depositing the gate side wall material on the entire surface, and the step of etching back the deposited gate side wall material by RIE process.

The hard mask 34 on the regions to be the source/drain regions are removed by RIE process. The RIE process conditions (the etching conditions) and the thickness of the hard mask 39 are adjusted so that the hard mask 39 remains after the hard mask 34 is removed.

Figure 21:
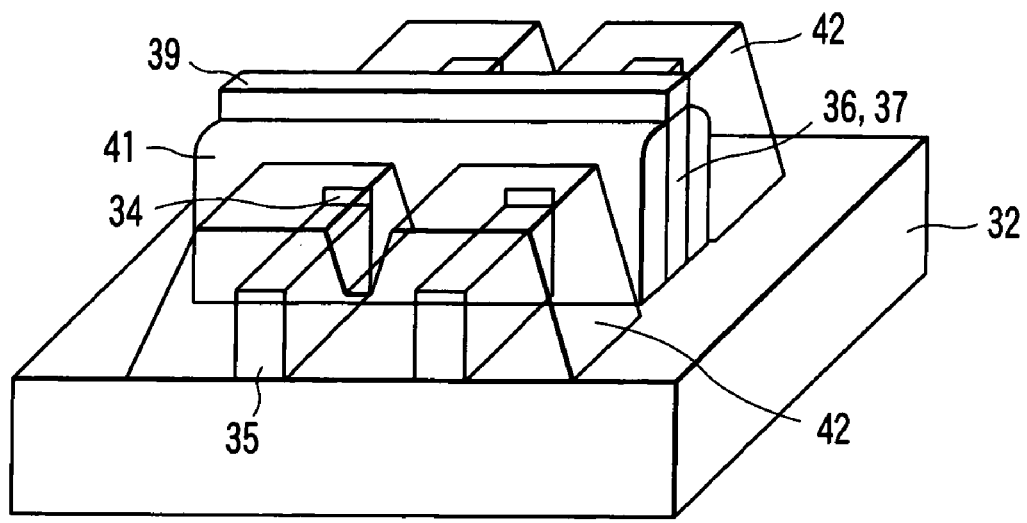
FIG. 21 is a perspective view illustrating a process for manufacturing the transistor following FIG. 20.

Next, the height of the source/drain regions is increased by epitaxial growth which grows Si layers 42 (Si epitaxial layers) on a region including the Si-Fin portions 35 in the source/drain regions (FIG. 21).

Figure 22:
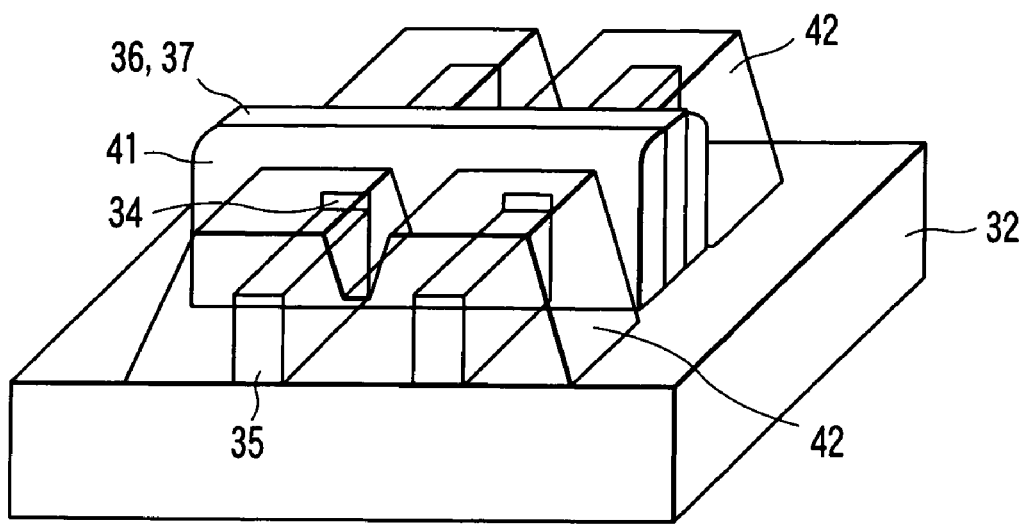
FIG. 22 is a perspective view illustrating a process for manufacturing the transistor following FIG. 21.

Next, the hard mask 39 on the polycrystalline Si gate electrodes 36, 37 is removed by hot phosphoric acid (FIG. 22).

Figure 23:
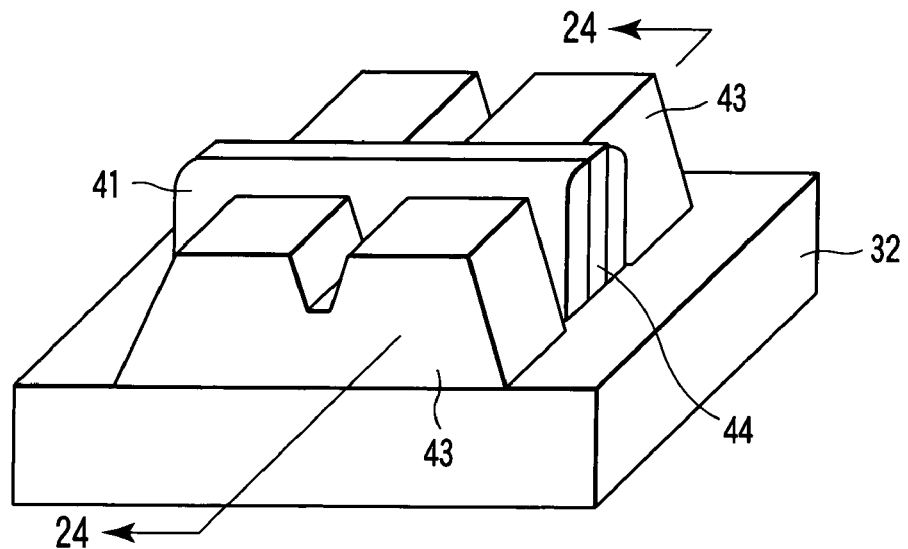
FIG. 23 is a perspective view illustrating a process for manufacturing the transistor following FIG. 22.
Figure 24:
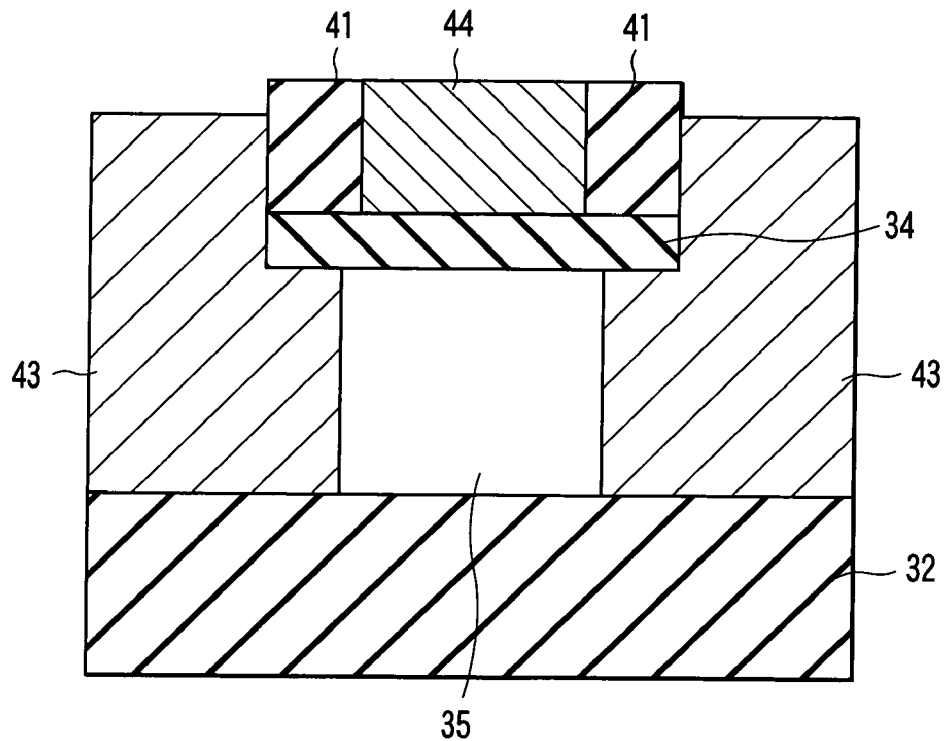
FIG. 24 is an A-A' cross sectional view shown in FIG. 23.

Next, metal film (not shown), such as refractory metal film, is formed on the region including the Si epitaxial layers 42 and the polycrystalline Si gate electrode 36, 37. The Si-Fin portions 35 and the Si epitaxial layers 42 are turned into metal semiconductor compound portions 43, the polycrystalline Si gate electrode 36, 37 is turned into a metal semiconductor compound gate electrode 44 by thermal treatment which to make the Si-Fin portions 35, Si epitaxial layers 42, and polycrystalline Si gate electrodes 36, 37 react with the metal film respectively (FIG. 23). FIG. 24 is a cross-sectional view of the MOS transistor, taken along the line A-A of FIG. 23. The non-reacted portion of the metal film is removed.

The material of the metal semiconductor compound gate electrode 44 is nickel silicide, for example. In the case of the nmOS, the boron implanted beforehand into the polycrystalline Si gate electrodes 36 and 37 is segregated on an interface between the metal semiconductor compound gate electrode 44 and the gate insulating film, and in the case of a PMOS, the arsenic or phosphorus implanted beforehand into the polycrystalline Si gate electrode 36, 37 is segregated on an interface between the metal semiconductor compound gate electrode 44 and the gate insulating film. As a result, the work function of the gate electrodes of the nmOS becomes larger than 4.6 eV (the mid-gap of Si), and the work function of the gate electrodes of the PMOS becomes smaller than 4.6 eV (the opposite from work function with a conventional inversion-mode MOS transistor). Thus, the desired threshold voltage can easily be achieved.

According to the present embodiment, the double-gate Fin-type MOS transistor that operates in the accumulation mode and has a Schottky source/drain structure can be obtained, and the following effects can be achieved.

(1) The double-gate structure and the Schottky source/drain structure make the transistor highly resistant to short channel effects (the problem with conventional accumulation-mode MOS transistors can be eliminated).

(2) Since the extension and deep junction are not required, the manufacturing cost of the transistor can be reduced, and the process for manufacturing the transistor can be simplified (one of the problems with conventional double-gate Fin-type MOS transistors can be eliminated).

(3) The resistance Rc (the interface resistance between Si and silicide) in the source/drain regions can be reduced (the drive current $I_{on}$ can be increased). This is because a decrease in the Schottky barrier is realized (the barrier is made thinner) by a high electric field (at the Schottky junction) formed by the relatively high concentration n-type body and the electric field applied from the double-gate structure. The aspect that the interface resistance Rc can be reduced without forming the extension diffusion layers in the body is a great merit.

(4) The Si film in the gate region and the source/drain regions can be simultaneously silicided. Accordingly, the manufacturing cost can be made lower than in the case where the Si film in the gate region and the Si film in the source/drain regions are silicided separately from each other.

Fifth Embodiment

Figure 25:
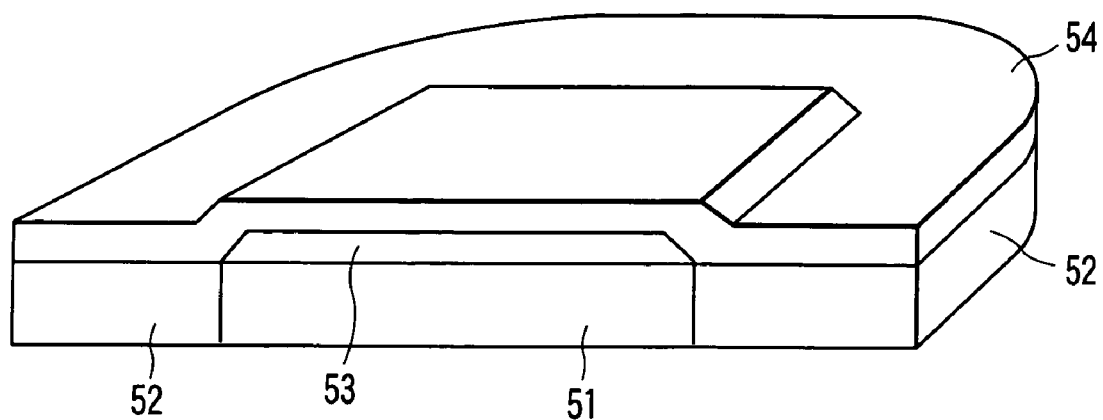
FIG. 25 illustrates a process for manufacturing a MOS transistor that includes a Schottky source/drain structure according to the fifth embodiment of the present invention.
Figure 26:
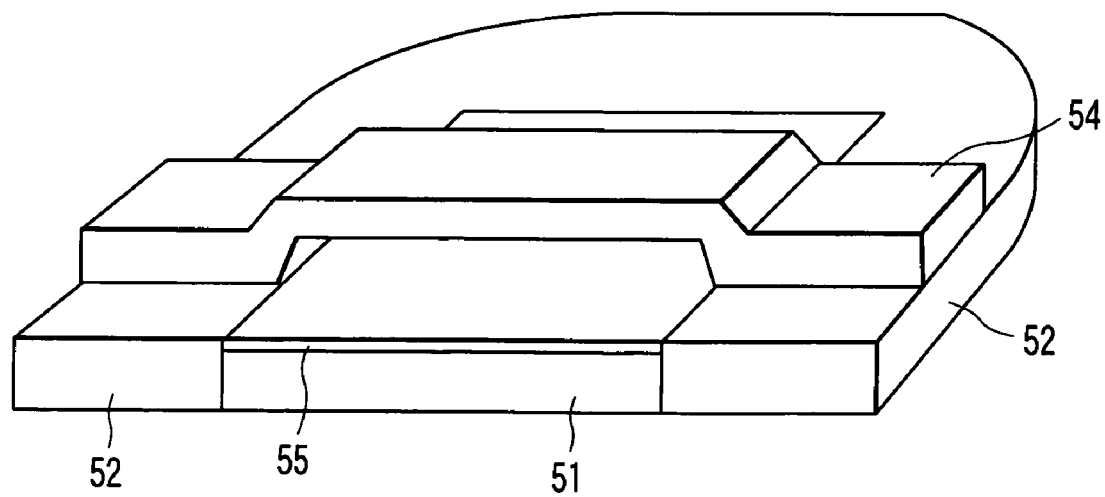
FIG. 26 is a perspective view illustrating a process for manufacturing the transistor following FIG. 25.
Figure 27:
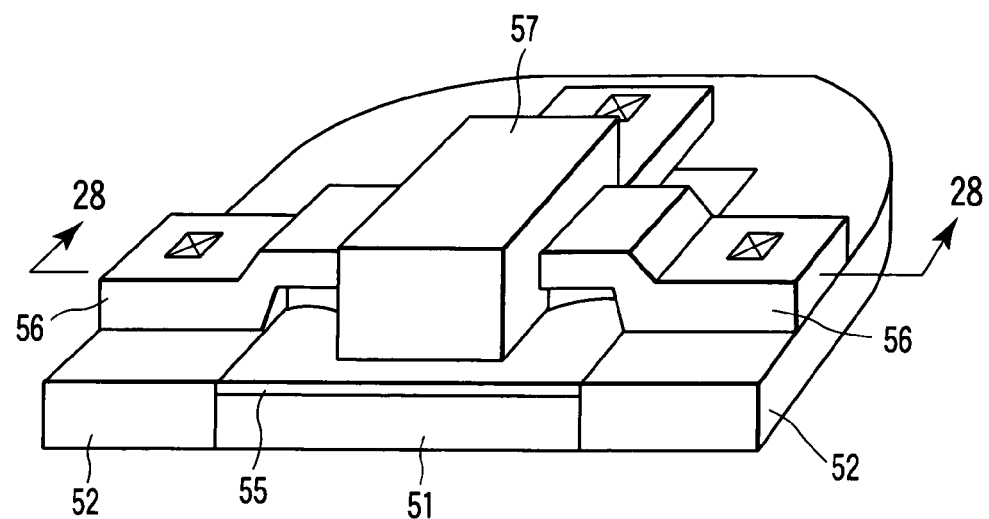
FIG. 27 is a perspective view illustrating a process for manufacturing the transistor following FIG. 26.

FIGS. 25 to 27 are perspective views illustrating a process for manufacturing a MOS transistor that includes a Schottky source/drain structure according to the fifth embodiment of the present invention. The MOS transistor of the present embodiment is used for a logic LSI circuit, for example.

First, a bulk Si substrate 51 is prepared. An isolation region 52 is formed on the surface of the Si substrate 51. The isolation region 52 comprises an embedded insulating film that is formed by the STI (Shallow Trench Isolation) process, for example. A SiGe layer 53 of approximately 50 nm in thickness is formed on the surface (the device region) of the Si substrate 51 by a selective epitaxial growth process. A Si layer 54 of approximately 30 nm in thickness is formed on the Si substrate 51, the isolation region 52, and the SiGe layer 53 by a non-selective epitaxial growth process (FIG. 25).

The SiGe layer 53 and the Si layer 54 are processed to form the active regions (channel regions and source/drain regions) by a lithography process and a RIE process. Arsenic ions or phosphorus ions (an n-type impurity) are implanted into the Si layer 54 by ion implantation. Further, the n-type impurity is activated by annealing, so that the conductivity type of the Si layer 54 is changed to n type. Here, the n-type impurity may be implanted in the SiGe layer 53. Using a chemical solution, the SiGe layer 53 is selectively removed. As a result, the n-type Si layer (body) 54 that has a bridge-like structure is formed. An insulating film 55 is formed on an exposed surface of the Si substrate 51 where the SiGe layer 53 is removed (FIG. 26).

Next, a gate insulating film 58(not shown) is formed on the body 54 in the channel regions, thereafter, a polycrystalline silicon film (not shown) is formed on the entire surface by LPCVD process. Here, the concavity under the channel regions is filled with the polycrystalline silicon film. The polycrystalline silicon film is processed by lithography process and RIE process, so as to form a gate electrode. Spacers (thin side wall insulating films) not shown are formed on the side walls of the gate electrode polycrystalline silicon film. Thereafter, as in the third and fourth embodiments, the body 54 in the source/drain regions is turned into a metal semiconductor compound 56, and the gate electrode polycrystalline silicon film is turned into a metal semiconductor compound gate electrode 57 (FIG. 27).

Figure 28:
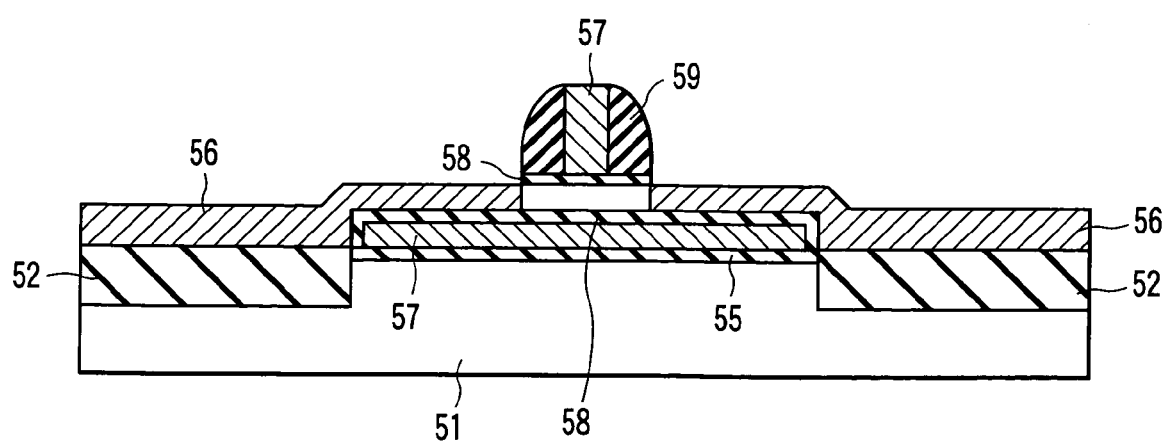
FIG. 28 is an A-A' cross sectional view shown in FIG. 27.

FIG. 28 is a cross-sectional view of the MOS transistor taken along the line A-A of FIG. 27. This cross-sectional view shows the MOS transistor in which the gate electrode 57 and the source/drain regions 56 are made of different metal semiconductor compounds from each other, as in the third embodiment. In FIG. 28, reference numeral 58 indicates the gate insulating film, and reference numeral 59 indicates the spacers (the side wall insulating films).

According to the present embodiment, a double-gate planar-type MOS transistor that operates in the accumulation mode and has a Schottky source/drain structure can be obtained, and the following effects can be achieved.

(1) The double-gate structure and the Schottky source/drain structure make the transistor highly resistant to short channel effects (the problem with conventional accumulation-mode MOS transistors can be eliminated).

(2) Since the extension or deep junction are not required, the manufacturing cost of the transistor can be reduced, and the process for manufacturing the transistor can be simplified (one of the problems with conventional double-gate Fin-type MOS transistors can be eliminated).

(3) The resistance Rc (the interface resistance between Si and silicide) in the source/drain regions can be reduced (the drive current $I_{on}$ can be increased). This is because a decrease in the Schottky barrier is realized (the barrier is made thinner) by a high electric field (at the Schottky junction) formed by the relatively high-concentration n-type body and the electric field applied from the double-gate structure. The aspect that the interface resistance Rc can be reduced without forming the extension diffusion layers in the body 1 is a great merit.

(4) The silicide material of the source/drain regions is ErSi in the nmOS and is PtSt in the PMOS. Accordingly, the interface resistance Rc is reduced, and high driving force can be achieved.

(5) The silicide material of the gate electrodes is PtSi in the nmOS and is ErSi in the PMOS. Accordingly, the threshold voltage of the transistor can be adjusted to a reasonable voltage of 0.2 V or lower.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate; and
    a MOS transistor provided on the semiconductor substrate and having a channel type of a first conductivity type,
    the MOS transistor comprising a semiconductor region of the first conductivity type including first and second channel regions of the first conductivity type, gate insulating films provided on the first and second channel regions, a gate electrode provided on the gate insulating films, and first and second source/drain regions which are located at a distance from each other so as to sandwich the first and second channel regions, the first and second source/drain regions contacting the semiconductor region of the first conductivity type and forming a Schottky junction,
    wherein the MOS transistor is configured to operate in an accumulation mode.

2. The semiconductor device according to claim 1,
    wherein the gate electrode includes a first metal semiconductor compound or metal, and the first and second source/drain regions include a second metal semiconductor compound or metal.

3. The semiconductor device according to claim 2,
    wherein the first metal semiconductor compound is the same material as the second metal semiconductor compound.

4. The semiconductor device according to claim 2,
    wherein the first metal semiconductor compound or metal is different from the second metal semiconductor compound or metal.

5. The semiconductor device according to claim 2,
    wherein the semiconductor region of the first conductivity type includes a semiconductor layer in a shape of a rectangular parallelepiped, and the first and second channel regions are located on two side surfaces of the semiconductor layer that are located opposite to each other.

6. The semiconductor device according to claim 2,
    wherein, in a case where the channel type of the MOS transistor is n-type, a work function of the gate electrode is greater than a mid-gap energy of the semiconductor region of the first conductivity type, and, in a case where the channel type of the MOS transistor is p-type, the work function of the gate electrode is smaller than the mid-gap energy of the semiconductor region of the first conductivity type.

7. The semiconductor device according to claim 6,
    wherein the semiconductor region of the first conductivity type is a Si region, and the mid-gap energy is 4.6 eV.

8. The semiconductor device according to claim 2,
    wherein the semiconductor substrate is an SOI substrate.

9. The semiconductor device according to claim 2,
    wherein, in a case where the channel type of the MOS transistor is p-type, the gate electrode includes RuTa, Ta, Hf—AIN, TaN, Mo (with Ar being ion implanted therein), Ti, or Er, and the first and second source/drain regions include Ru, Ta—AIN, Mo, NiGe, Pt, Ni, or W.

10. The semiconductor device according to claim 2,
    wherein, in a case where the channel type of the MOS transistor is n-type, the gate electrode includes Ru, Ta—AlN, Mo, NiGe, Pt, Ni, or W, and the first and second source/drain regions include RuTa, Ta, Hf—AlN, TaN, Mo (with Ar being ion implanted therein), Ti, or Er.

11. The semiconductor device according to claim 1, wherein the semiconductor region of the first conductivity type includes a semiconductor layer in a shape of a rectangular parallelepiped, and the first and second channel regions are located on two side surfaces of the semiconductor layer that are located opposite to each other.

12. The semiconductor device according to claim 1, wherein, in a case where the channel type of the MOS transistor is n-type, a work function of the gate electrode is greater than a mid-gap energy of the semiconductor region of the first conductivity type, and, in a case where the channel type of the MOS transistor is p-type, the work function of the gate electrode is smaller than the mid-gap energy of the semiconductor region of the first conductivity type.

13. The semiconductor device according to claim 12, wherein the semiconductor region of the first conductivity type is a Si region, and the mid-gap energy is 4.6 eV.

14. The semiconductor device according to claim 1, wherein the semiconductor substrate is an SOI substrate.

15. The semiconductor device according to claim 1, wherein, in a case where the channel type of the MOS transistor is p-type, the gate electrode includes RuTa, Ta, Hf—AlN, TaN, Mo (with Ar being ion implanted therein), Ti, or Er, and the first and second source/drain regions include Ru, Ta—AlN, Mo, NiGe, Pt, Ni, or W.

16. The semiconductor device according to claim 1, wherein, in a case where the channel type of the MOS transistor is n-type, the gate electrode includes Ru, Ta—AlN, Mo, NiGe, Pt, Ni, or W, and the first and second source/drain regions include RuTa, Ta, Hf—AlN, TaN, Mo (with Ar being ion implanted therein), Ti, or Er.

17. A method of manufacturing a semiconductor device comprising forming a MOS transistor having a channel type of a first conductivity type on a semiconductor substrate, the forming the MOS transistor comprising:
   forming first and second semiconductor regions to be first and second source/drain regions, and a semiconductor region of the first conductivity type including first and second channel regions of the first conductivity type, thereby configuring the MOS transistor to operate in an accumulation mode;
   forming a semiconductor film on the first and second channel regions via gate insulating films; and
   turning the first and second semiconductor regions and the semiconductor film into metal semiconductor compound regions including metal and semiconductor.

18. The method of manufacturing a semiconductor device according to claim 17, wherein the turning the first and second semiconductor regions and the semiconductor film into the metal semiconductor compound regions including the metal and semiconductor comprises turning the first and second semiconductor regions into a first metal semiconductor compound regions including a first metal and a semiconductor; and turning the semiconductor film into a second metal semiconductor compound region including a second metal which is different from the first metal, and a semiconductor.

19. The method of manufacturing a semiconductor device according to claim 17, wherein the turning the first and second semiconductor regions and the semiconductor film into the metal semiconductor compound regions including the metal and semiconductor comprises turning the first and second semiconductor regions and the semiconductor film into metal semiconductor compound regions including the same metal.

20. A method of manufacturing a semiconductor device comprising forming a MOS transistor having a channel type of a first conductivity type on a semiconductor substrate, the forming the MOS transistor comprising:
   forming first and second semiconductor regions to be first and second source/drain regions, and a semiconductor region of the first conductivity type including first and second channel regions of the first conductivity type, thereby configuring the MOS transistor to operate in an accumulation mode;
   forming a semiconductor film on the first and second channel regions via gate insulating films; and
   depositing a metal material on the first and second semiconductor regions and a region where the semiconductor film is removed.

* * * * *